US006685844B2

(12) United States Patent
Rich et al.

(10) Patent No.: US 6,685,844 B2
(45) Date of Patent: Feb. 3, 2004

(54) DEEP REACTIVE ION ETCHING PROCESS AND MICROELECTROMECHANICAL DEVICES FORMED THEREBY

(75) Inventors: David Boyd Rich, Kokomo, IN (US); John C. Christenson, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 455 days.

(21) Appl. No.: 09/782,393

(22) Filed: Feb. 14, 2001

(65) Prior Publication Data

US 2002/0109207 A1 Aug. 15, 2002

(51) Int. Cl.⁷ .................................................. B81C 1/00
(52) U.S. Cl. .............................. 216/2; 216/67; 216/79; 257/415; 438/52
(58) Field of Search ............................. 216/2, 57, 67, 216/72, 79; 257/415; 438/50, 52, 53; 73/514.01

(56) References Cited

U.S. PATENT DOCUMENTS

| 5,450,751 | A | 9/1995 | Putty et al. ............... 73/504.18 |
| 5,547,093 | A | 8/1996 | Sparks ........................... 216/2 |
| 5,872,313 | A | 2/1999 | Zarabadi et al. ............... 73/497 |
| 6,127,273 | A | 10/2000 | Laermer et al. ............ 438/709 |
| 6,257,062 | B1 | 7/2001 | Rich ........................ 73/514.32 |
| 2002/0127760 | A1 * | 9/2002 | Yeh et al. ...................... 438/50 |

OTHER PUBLICATIONS

Research Disclosure, Jun. 1999 No. 422, No. 42271, p. 828.

* cited by examiner

Primary Examiner—Allan Olsen
(74) Attorney, Agent, or Firm—Jimmy L. Funke; Stefan V. Chmielewski (57) ABSTRACT

A process for forming a microelectromechanical system (MEMS) device by a deep reactive ion etching (DRIE) process during which a substrate overlying a cavity is etched to form trenches that breach the cavity to delineate suspended structures. A first general feature of the process is to define suspended structures with a DRIE process, such that the dimensions desired for the suspended structures are obtained. A second general feature is the proper location of specialized features, such as stiction bumps, vulnerable to erosion caused by the DRIE process. Yet another general feature is to control the environment surrounding suspended structures delineated by DRIE in order to obtain their desired dimensions. A significant problem identified and solved by the invention is the propensity for the DRIE process to etch certain suspended features at different rates. In addition to etching wider trenches more rapidly than narrower trenches, the DRIE process erodes suspended structures more rapidly at greater distances from anchor sites of the substrate being etched. At the masking level, the greater propensity for backside and lateral erosion of certain structures away from substrate anchor sites is exploited so that, at the completion of the etch process, suspended structures have acquired their respective desired widths.

22 Claims, 4 Drawing Sheets

DEEP REACTIVE ION ETCHING PROCESS AND MICROELECTROMECHANICAL DEVICES FORMED THEREBY

TECHNICAL FIELD

The present invention generally relates to micromachined devices, and particularly microelectromechanical system (MEMS) devices formed by etching processes. More particularly, this invention relates to a micromachining process and design elements for a MEMS device using a deep reactive ion etching (DRIE) process to improve yields and device reliability.

BACKGROUND OF THE INVENTION

A wide variety of MEMS devices are known, including accelerometers, rate sensors, actuators, motors, microfluidic mixing devices, springs for optical-moving mirrors, etc. As an example, rotational accelerometers that employ MEMS devices are widely used in computer disk drive read/write heads to compensate for the effects of vibration and shock. Other applications for rotational accelerometers that use MEMS devices include VCR cameras and aerospace and automotive safety control systems and navigational systems. Rotational rate sensors and accelerometers have been developed whose MEMS devices are fabricated in a semiconductor chip. Notable MEMS devices that employ a proof mass for sensing rotational rate or acceleration include a plated metal sensing ring disclosed in U.S. Pat. No. 5,450,751 to Putty et al., and an electrically-conductive, micromachined silicon sensing ring disclosed in U.S. Pat. No. 5,547,093 to Sparks, both of which are assigned to the assignee of this invention. Sparks' sensing ring is formed by etching a chip formed of a single-crystal silicon wafer or a polysilicon film on a silicon or glass handle wafer. A sensor disclosed in U.S. Pat. No. 5,872,313 to Zarabadi et al., also assigned to the assignee of the present invention, employs a sensing ring and electrodes with interdigitized members. The positions of the interdigitized members relative to each other enable at least partial cancellation of the effect of differential thermal expansion of the ring and electrodes, reducing the sensitivity to temperature variations in the operating environment of the sensor. Each of the above sensors operates on the basis of capacitively sensing movement of their rings. The sensing rings are supported by a central hub or pedestal. Surrounding the rings are drive electrodes that drive the rings into resonance, while sensing electrodes that also surround the rings serve to capacitively sense the proximity of the ring (or nodes on the ring) which varies due to Coriolis forces that occur when the resonating ring is subjected to rotary motion.

Another notable MEMS device that employs a silicon proof mass for sensing rotational acceleration is disclosed in U.S. patent application Ser. No. 10/410,712 now U.S. Pat. No. 6,257,062 to Rich, incorporated herein by reference. Rich discloses a disk-shaped proof mass supported above a cavity formed in a substrate. Instead of being centrally supported by a pedestal, Rich's proof mass is suspended from its perimeter with tethers anchored to the substrate rim surrounding the proof mass. The tethers allow the proof mass to rotate about an axis perpendicular to the plane containing the proof mass and tethers. Fingers extend radially outward from the proof mass and are interdigitized with fingers extending radially inward from the substrate rim. The cantilevered fingers of the proof mass and rim are capacitively coupled to produce an output signal that varies as a function of the distances between adjacent paired fingers, which in turn varies with the angular position of the proof mass as it rotates about its axis of rotation in response to a rotational acceleration.

Sensors of the type described above are capable of extremely precise measurements, and are therefore desirable for use in a wide variety of applications. However, the intricate proof masses and associated sensing structures required for such sensors must be precisely formed in order to ensure the proper operation of the sensor. For example, Rich's device requires a sufficient gap between paired interdigitized fingers to prevent stiction and shorting, yet paired fingers must also be sufficiently close to maximize the capacitive output signal of the sensor. Rich employs stiction bumps formed on the proof mass fingers to inhibit stiction between closely-spaced fingers. Increasing the area of the fingers to achieve greater capacitive coupling would result in increased capacitive output for a given finger gap. However, traditional etching techniques have not generally been well suited for mass-producing silicon micromachines with high aspect ratios necessary to etch closely-spaced fingers in a relatively thick substrate. For example, with conventional etching techniques it is difficult to achieve a 10:1 aspect ratio capable of forming interdigitized fingers spaced three micrometers apart in a silicon substrate that is thirty micrometers thick. In addition to operational considerations, there is a continuing emphasis for motion sensors that are lower in cost, which is strongly impacted by process yield, yet exhibit high reliability and performance capability. Consequently, improvements in the processing of MEMS devices for sensing and other applications are highly desirable. Deep reactive ion etching (DRIE) is a process known as being capable of performing deep, high aspect ratio anisotropic etches of silicon and polysilicon, and is therefore desirable for producing all-silicon MEMS of the type taught by Rich. However, DRIE is a young technology practiced largely for research and development. Accordingly, to take advantage of the unique capabilities of the DRIE process, its etch idiosyncrasies must be determined and reconciled to render it suitable for mass production.

SUMMARY OF THE INVENTION

The present invention provides a process and design elements for a microelectromechanical system (MEMS) device by a deep reactive ion etching (DRIE) process during which a substrate overlying a cavity is etched to form trenches that breach the cavity to delineate suspended structures. The invention is particularly useful in the fabrication with a DRIE process of semiconductor MEMS devices used to sense motion or acceleration, which typically include a proof mass suspended above a cavity so as to have an axis of rotation perpendicular to the plane of the proof mass, as taught by Rich, Sparks and Zarabadi et al. While the invention will be illustrated in reference to a MEMS device with a proof mass, the invention is applicable to essentially any suspended structure that can be fabricated by forming a trench in a substrate overlying a cavity.

According to the invention, in addition to a relatively large member such as a proof mass, MEMS devices also may include additional and smaller structures that are suspended above the same cavity, such as the tethers and cantilevered fingers of Rich. A first general feature of the invention is the ability to define suspended structures with a DRIE process, such that the dimensions desired for the suspended structures are obtained. A second general feature of the invention is the ability to define specialized features, such as stiction bumps that, if delineated by DRIE, must be properly located between suspended structures in order to be effective in improving the reliability of the MEMS device. Yet another general feature of the invention is the control of the environment surrounding suspended structures delineated by DRIE in order to obtained their desired dimensions.

A significant problem identified and solved by the present invention is the propensity for the DRIE process to etch suspended features at different rates. DRIE has been determined to etch wide trenches more rapidly than narrower trenches. According to the invention, DRIE etches or, more accurately, erodes suspended structures more rapidly at greater distances from anchor sites of the substrate being etched, which occurs when a suspended structure becomes isolated from the bulk substrate when the trench(s) that delineates the structure breaches the cavity. (As used herein, an anchor site is a location on the bulk of the substrate from which the suspended structure is ultimately supported from the bulk of the substrate.) Consequently, though two suspended structures are separated by a gap of constant width, DRIE processes have been determined to more rapidly erode the suspended structure located farther from an anchor site. Using Rich's MEMS device as an example, once the proof mass is separated from the bulk of the substrate using a DRIE process. the proof mass fingers etch more rapidly than the rim fingers because the rim fingers are anchored (cantilevered) directly from the rim of the bulk substrate surrounding the proof mass, while the proof mass fingers are ultimately anchored to the rim of the bulk substrate through the tethers that suspend the proof mass from the same rim of the bulk substrate. A consequence of this more rapid etch is backside erosion and lateral thinning of the proof mass fingers.

In view of the above, in order to DRIE etch a substrate above a cavity to form suspended structures above the cavity, in which a first of the suspended structures is farther from the substrate anchor site than the second suspended structure, the present invention exploits the greater propensity for backside and lateral erosion of certain structures farther from substrate anchor sites so that, at the completion of the etch process, all suspended structures have acquired their respective desired widths. In this example, first and second surface regions of the substrate corresponding to the first and second suspended structures are masked in preparation for the DRIE etching process, leaving exposed those surface regions of the substrate corresponding to the trenches that will surround and delineate the suspended structures. The first masked surface region is intentionally wider than the desired width of the first suspended structure, thus resulting in the adjacent exposed surface region being narrower than the width desired for the trench that will delineate the first suspended structure. The first and second suspended structures are then concurrently DRIE etched. According to the invention, as a result of the first suspended structure being a greater distance from the anchor site than the second suspended structure, the first suspended structure is subject to backside and lateral erosion after the cavity is breached, causing the first structure to narrow and eventually acquire its desired lateral width during completion of the etch. As a result, the first masked surface region is intentionally undercut so that, at the completion of the etch process, the first and second suspended structures have acquired their respective desired widths.

The tendency for DRIE to etch wider trenches more rapidly than narrower trenches, a phenomenon which may be termed "etch lag," is also detrimental to the formation of suspended features for the same reasons explained above. An example is where first and second suspended structures are to be DRIE etched in a substrate over a cavity, in which the first structure is delineated by a wider trench than the second structure. Because the wider trenches of the first structure etch more rapidly during DRIE etching, the wider trenches breach the underlying cavity before the narrower trenches of the second structure, leading to backside erosion and lateral narrowing as explained previously. This phenomenon would be compensated for by masking the substrate so that the masked surface region corresponding to the first structure is intentionally wider than desired, resulting in the adjacent exposed surface regions being narrower than the width desired for the trench that will delineate the first structure, yet wider than the exposed surface regions of the substrate corresponding to the trench that will surround and delineate the second structure. The trench formed in the wider exposed surface regions of the first structure breaches the underlying cavity before the narrower trench of the second structure, with the resulting backside and lateral erosion of the first structure causing the first structure to narrow and eventually substantially acquire its desired width during completion of the etch of the narrower trench surrounding the second structure. However, this scenario is complicated by the findings of the present invention that backside and lateral erosion occur more rapidly with those suspended structures located farther from an anchor site. This invention provides two approaches for addressing this problem. A first is to taper the width of the mask for a suspended structure while maintaining a constant gap width for the exposed surface area in which the trench will be etched to delineate the structure. The mask is tapered to be wider with increasing distance from the anchor site, so that as the width of the mask increases, backside and lateral erosion is correspondingly more rapid to eventually produce a substantially uniform width for the structure. Alternatively, the width of the mask for a suspended structure is maintained constant while tapering the gap width for the exposed surface area in which the trench will be etched to delineate the structure. The gap is tapered to be wider with decreasing distance from the anchor site, so that backside and lateral erosion of the structure that occurs more rapidly with increasing distance from the anchor site is balanced by the more rapid etch rate associated with the increasingly wider gap near the anchor site. As a result, a substantially uniform width for the structure can again be obtained.

The teachings of this invention concerning the relationship between distance to an anchor site and backside and lateral erosion is also pertinent to other aspects of DRIE etching a MEMS device. As previously noted, a feature of the invention is the ability to properly define specialized elements, such as stiction bumps. According to the invention, stiction bumps must be defined in regions of the substrate away from those areas in which accelerated backside and lateral erosion will occur. Also a feature of this invention is maintaining a proper environment surrounding suspended structures, such as by eliminating unnecessary variations in trench width. An important example is avoiding intersecting trenches that would create a localized wider gap prone to more rapid etching and subsequent backside and lateral erosion, resulting in vertical notches at the intersections.

In view of the above, it can be seen that the present invention provides a DRIE etching process by which suspended structures of desired widths can be more precisely formed. As a result, the present invention is able to take advantage of the deep etching capability of the DRIE process, while compensating for etch idiosyncrasies that would otherwise adversely affect the structural integrity and durability of a MEMS device, so as to improve yields and device reliability.

Other objects and advantages of this invention will be better appreciated from the following detailed description.

DESCRIPTION OF THE PREFERRED EMBODIMENT

Figure 4:
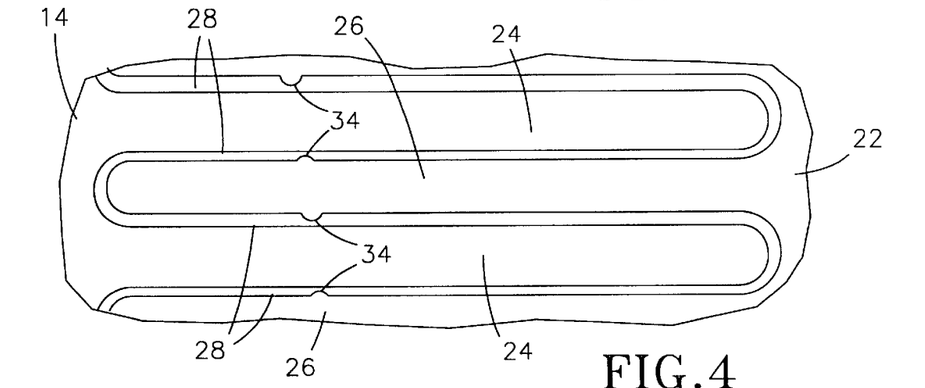
FIG. 4 is a detailed plan view of several interdigitized proof mass and rim fingers of the MEMS device of FIG. 1.
Figure 5:
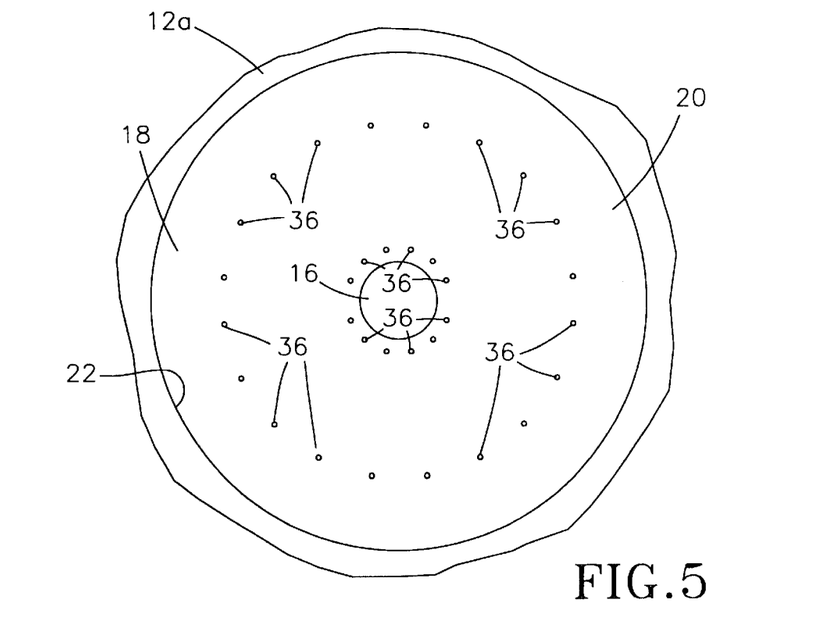
FIG. 5 is a plan view of the floor of the cavity in which the MEMS device of FIG. 1 is located.
Figure 6:
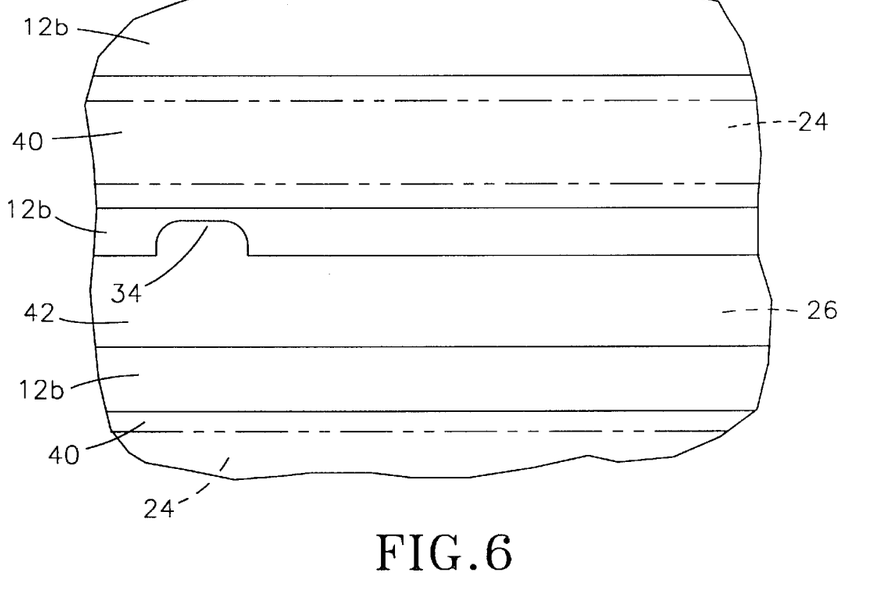
FIGS. 6 and 7 are plan views showing portions of an etch mask used in the fabrication of the fingers and tethers, respectively, of the MEMS device of FIG. 1.
Figure 7:
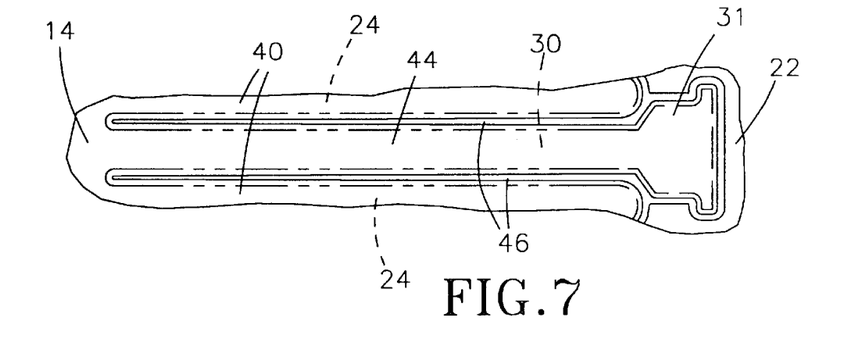
Figure 8:
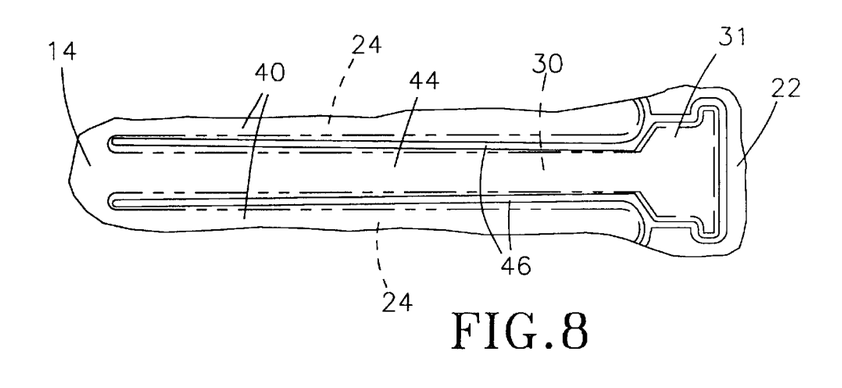
FIG. 8 is a plan view showing a portion of an alternative etch mask used in the fabrication of the tethers of the MEMS device of FIG. 1.

FIGS. 1 through 5 represent a MEMS device 10 fabricated with a DRIE process in accordance with the present invention, with masking steps of the DRIE process being represented in FIGS. 6 through 8. The device 10 is represented as a rotational accelerometer of the type disclosed by Rich, which is incorporated herein by reference. However, those skilled in the art will appreciate that the device 10 could be employed and modified for a variety of applications, including the rate sensors and accelerometers taught by Putty et al., Sparks and Zarabadi et al.

Figure 3:
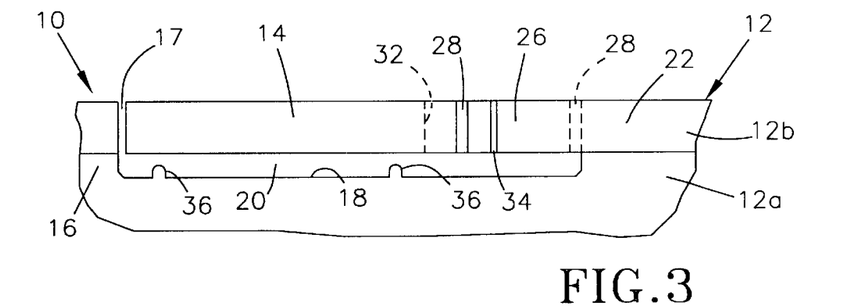

As illustrated, the device 10 includes a proof mass 14 formed in a sensing die 12. The die 12 is shown as including a semiconductor layer 12b on a substrate 12a (FIG. 3). A preferred material for the semiconductor layer 12b is epitaxial silicon and a preferred material for the substrate 12a is single-crystal silicon, though it is foreseeable that other materials could be used. For example, the substrate 12b could be formed of quartz, glass or any other advantageous substrate to which the semiconductor layer 12b could be bonded. In a preferred embodiment, a wafer containing the die 12 is processed by a known bond-etchback process, by which the substrate 12a is etched to form a cavity 20 and then oxidized to form a bond oxide layer (not shown) on its surface including the cavity 20, and the semiconductor layer 12b is epitaxially grown on a second wafer (not shown) and then bonded to the bond oxide layer of the substrate 12a. The second wafer is then selectively removed to leave only the epitaxial layer 12b on the substrate 12a and overlying the cavity 20, as shown in FIG. 3. While a bond-etchback process is preferred, it is foreseeable that other techniques could be used to produce the die 12 and enclosed cavity 20 of FIG. 3.

Figure 1:
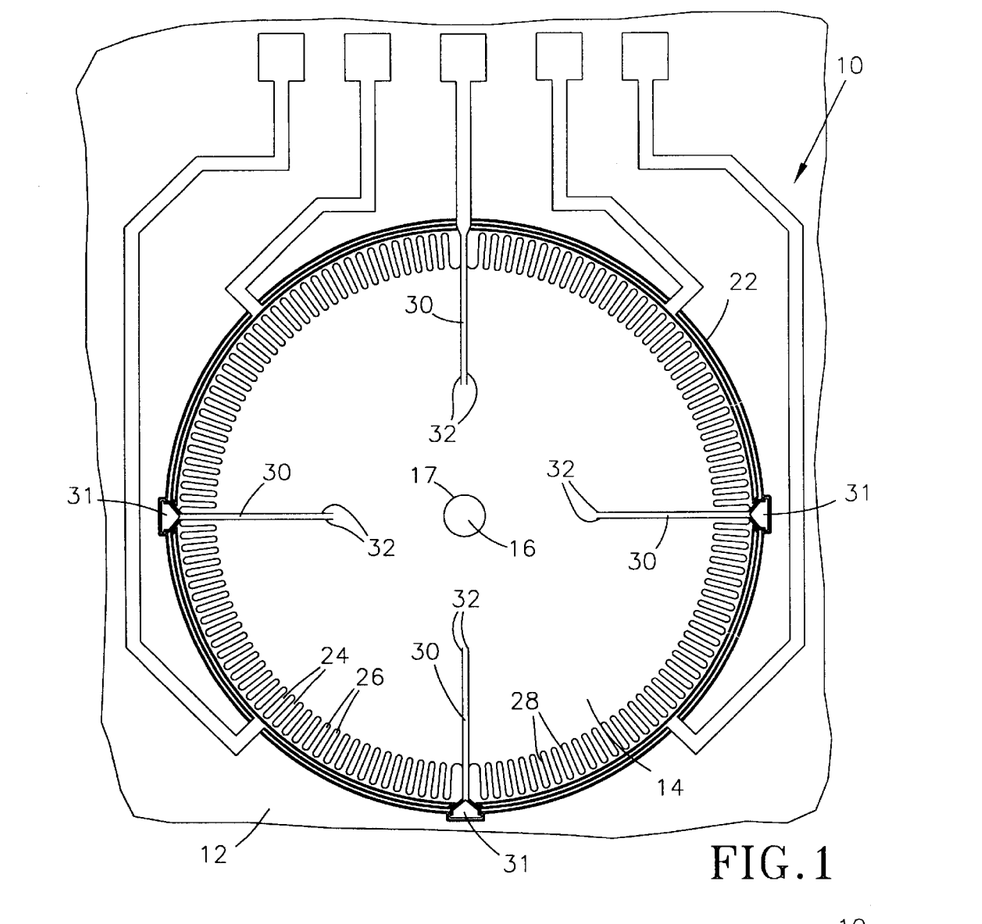
FIG. 1 is a plan view of a MEMS device in accordance with a preferred embodiment of this invention.
Figure 2:
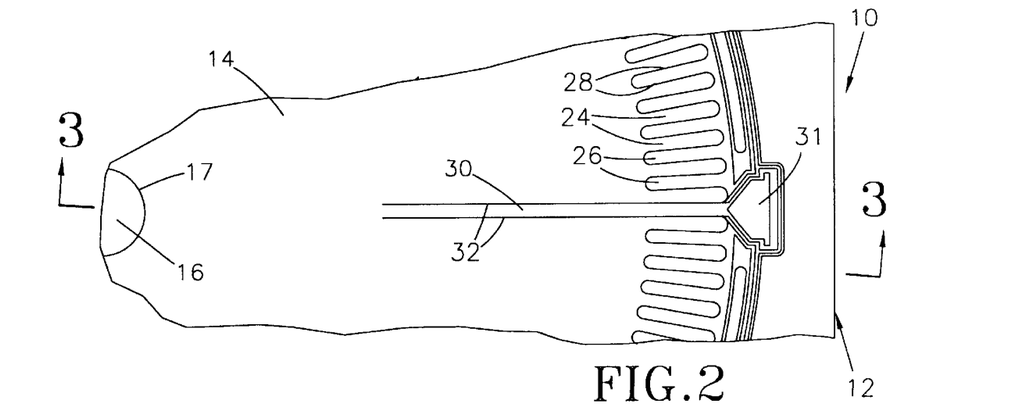
FIGS. 2 and 3 are plan and cross-sectional views, respectively, of a portion of the MEMS device of FIG. 1.

As also seen in FIGS. 1 through 3, the proof mass 14 is defined in the semiconductor layer 12b so as to be suspended above the floor 18 of the cavity 20 between a central hub 16 and a rim 22 formed by the semiconductor layer 12b. The proof mass 14 is attached to the bulk of the die 12 (through the semiconductor layer 12b) with four equiangularly-spaced tethers 30, and is completely separated from the hub 16 by a trench 17, whose width may be on the order of about seven micrometers. The tethers 30 provide that the primary and desired translational mode of the proof mass 14 is rotation within the plane of the proof mass 14 about the hub 16.

As seen in FIGS. 1 and 2, electrode fingers 24 radially extend outward from the proof mass 14, and are interdigitated with electrode fingers 26 that radially extend inward from the rim 22. The fingers 24 and 26 are separated by trenches 28 and roughly equiangularly spaced around the perimeter of the proof mass 14. In the preferred embodiment, the trenches 28 are of alternating greater and lesser widths, as is most readily apparent from FIG. 4, though it is foreseeable that a constant trench width could be used. Each of the narrower trenches 28 defines a capacitive gap between a pair of smooth capacitor plates defined by the pair of fingers 24 and 26 it separates. In contrast, the wider trenches 28 (which may be, for example, twice the width of the narrower trenches 28) provide air gaps that separate each pair of capacitively-coupled fingers 24 and 26 from adjacent paired fingers 24 and 26. These air gaps are effectively parasitic gaps, in that they do not positively contribute to device performance as do the capacitive gaps. The capacitor plates provided by the fingers 24 and 26 are preferably large relative to the width of the narrower trench 28 therebetween, which preferably has a uniform width of, for example, about three micrometers. When a voltage potential is present between pairs of capacitively-coupled fingers 24 and 26, the rim fingers 26 capacitively sense the proximity of the proof mass fingers 24, which will vary when the proof mass 14 is subjected to rotary motion. The large number of interdigitated fingers 24 and 26 of the device 10 produce a capacitive signal that is sufficiently large to measure and manipulate.

The operational requirements of the device 10 and its conditioning circuitry (not shown) will be appreciated by those skilled in the art, especially in reference to Rich, and therefore will not be discussed in any detail here. It is sufficient to say that the performance of the device 10 is generally enhanced by increasing the number of pairs of fingers 24 and 26, and improving the uniformity of the capacitive gaps (narrow trenches 28) while also minimizing the widths of the gaps. Other configurations for the device 10 are foreseeable, depending on the intended application and operating natural mode of the device.

As also shown in FIG. 1, each of the four tethers 30 extends from the interior of the proof mass 14, being separated from the proof mass 14 by trenches 32. The trenches 32 are typically on the order of about seven micrometers in width, similar to the trench 17 separating the proof mass 14 from the hub 16. The hub and tether trenches 17 and 32, respectively, can be termed structural gaps (as opposed to the capacitive and parasitic gaps formed by the finger trenches 28) in that they are inactive to device signal. However, the tether trenches 32 are important to device performance in that they affect the compliance and response of the device 10 to some stimulus. The opposite end of each tether 30 is anchored to a portion 31 of the semiconductor layer 12b, thereby supporting the proof mass 14 and, to a lesser extent, physically limiting rotation of the proof mass 14 relative to the rim 22. Because the tethers 30 provide the structural support for the proof mass 14, they are required to have specified widths (as measured in the plane of the proof mass 14) and thicknesses (as measured in the direction perpendicular to the plane of the proof mass 14) to achieve proper rotational compliance. The tethers 30 should also be free of irregularities, such as notches and other surface flaws that would weaken the tether 30, increase their compliance, and provide nucleation sites for cracks.

Stiction between the fingers 24 and 26 may still occur in view of the very narrow trenches 28 separating them. In Rich, stiction bumps were formed on the proof mass fingers, so as to face the adjacent rim fingers. In the event the proof mass rotates sufficiently to bring one or more of the proof mass fingers in contact with their adjacent rim fingers, stiction bumps prevent stiction, in which the fingers would permanently stick together as a result of electrostatic forces. However, in an investigation leading to the present invention, stiction bumps formed by DRIE on proof mass fingers in accordance with Rich were found to be ineffective in preventing stiction in the event of an extraordinary rotational translational stimulus. During the investigation, a second and unexpected source of stiction was determined to be an undesirable translational mode of the proof mass 14 in the Z-direction, i.e., perpendicular to the plane of the proof mass 14. The proof mass 14, which is relatively large compared to the gap separating it from the floor 18 of the cavity 20, can permanently stick to the cavity floor 18 if a requisite condition is met to cause Z-direction translation, such as a large static charge build-up on either the cavity floor 18 or the proof mass 14 during the DRIE etch, or water that wicks under the proof mass 14 and evaporates, pulling the proof mass 14 down into contact with the floor 18. The investigation leading to this invention resulted in solutions to both of the stiction problems. For reasons to be more fully explained below, the device 10 of this invention is preferably fabricated to have stiction bumps 34 formed only on the rim fingers 26, as depicted in FIGS. 3 and 4, and stiction bumps 36 formed at certain locations on the floor 18 of the cavity 20 directly beneath the proof mass 14, as shown in FIGS. 3 and 5.

The investigation was directed to the use of DRIE processing to form the hub trench 17, finger trenches 28 and tether trenches 32 that delineate the proof mass 14 fingers 24 and 26 and tethers 30 of the device 10 shown in FIG. 1. While having different widths, the structural trenches (hub trench 17 and tether trenches 32), the capacitive gaps (the narrower portions of the finger trenches 28), and the parasitic gaps (the wider portions of the finger trenches 28) preferably have a constant width along their lengths, though it is foreseeable that trenches with variable widths could be used. In the course of the investigation, it was determined that DRIE consistently caused certain suspended features to etch more rapidly than others. Specifically, the hub and tether trenches 17 and 32 (which are wider than the finger trenches 28) consistently etched more rapidly than the finger trenches 28. Conversely, the capacitive gaps formed by the narrower finger trenches 28 (which are narrower than the tether trenches 32 and the parasitic gaps formed by the wider finger trenches 28) were consistently the slowest to etch. Consequently, as a result of etch lag associated with DRIE, the hub trench 17 breached the cavity 20 beneath the proof mass 14 first, followed by the tether trenches 32 and the parasitic gaps formed by the wider finger trenches 28, and finally the capacitive gaps formed by the narrower finger trenches 28. However, etch lag could not account for all etch idiosyncracies observed with the device 10.

From FIG. 1, it can be appreciated that the suspended structures of the device 10 are not equidistant from the bulk of the die 12, the bulk being in reference to those portions of the die 12 other than the proof mass 14, fingers 24 and 26, and tethers 30 micromachined from the die 12. For example, the proof mass fingers 24 are farther from the bulk of the die 12 than the rim fingers 26, since the rim fingers 26 are anchored (cantilevered) directly from the rim 22, which is an integral portion of the bulk of the die 12, while the proof mass fingers 24 are ultimately anchored to the rim 22 through the proof mass 14 and the tethers 30 that suspend the proof mass 14 from the rim 22. Surprisingly, from the investigation it was also determined that the DRIE process more rapidly etched suspended structures as their distances from their anchor site (wafer bulk) increased. While not wishing to be held to any particular theory, it is believed that this phenomenon was caused in part by heat transfer and the highly charged environment of the DRIE process. As the proof mass 14 becomes increasingly isolated from the remainder of the semiconductor layer 12b as a result of the trenches 17, 28 and 32 breaching the cavity 20, heat transfer from the proof mass 14 to the bulk of the die 12 decreases, resulting in a temperature increase of the proof mass 14 and proof mass fingers 24 that may increase the etching rate. Similarly, the opportunity for charge build-up in the MEMS device 10 shown in the Figures is great, with static build-up resulting in uneven charge levels in different active regions within the die 12. In particular, a charge build-up is likely to occur in the proof mass 14 and its fingers 24 and tethers 30, as compared to the rim fingers 26 and the surrounding substrate (including the rim 22), particularly as the proof mass 14 becomes increasingly free from the remainder of the semiconductor layer 12b as the trenches 17, 28 and 32 are completed. It was shown that once one of the more rapidly etched trenches (e.g., the hub and tether trenches 17 and 32) breaches the cavity 20, the anisotropic nature of DRIE etching may cause highly directional and highly energetic physical etchant species to be reflected by the floor 18 of the cavity 20 onto the undersides of the immediately adjacent suspended structures (portions of the proof mass 14, fingers 24 and 26, and tethers 30), causing both backside erosion of these structures and unintentional lateral thinning.

Figure 9:
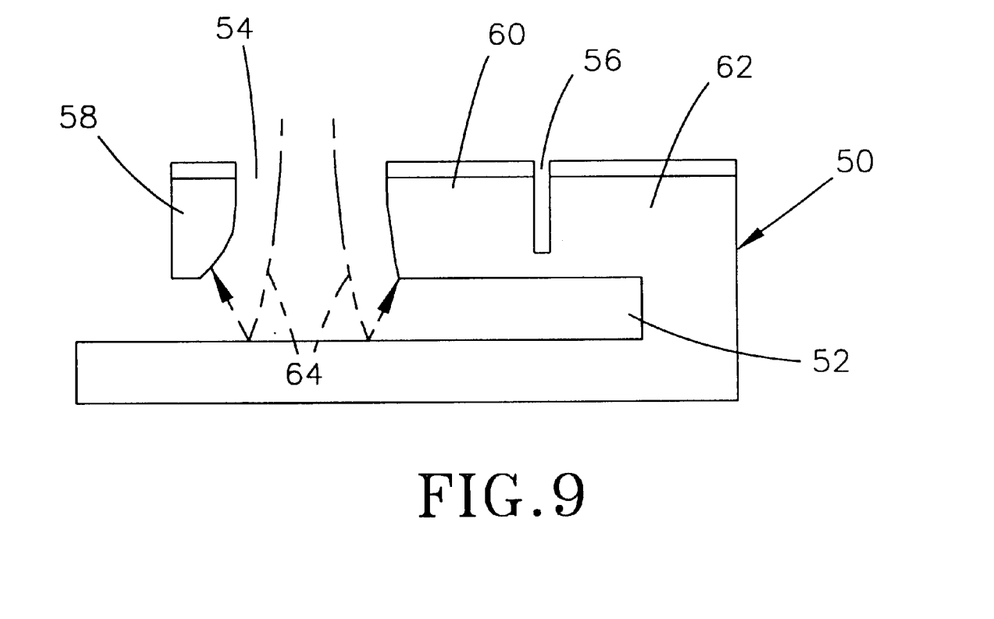
FIGS. 9 and 10 schematically illustrate a DRIE etch idiosyncracy identified with the present invention.
Figure 10:
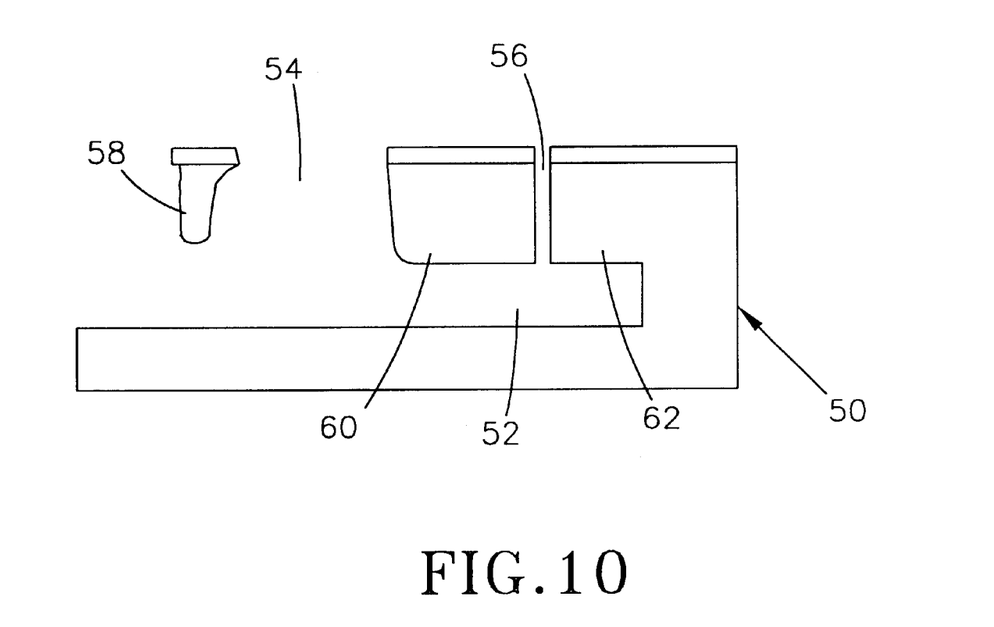

The above-described phenomenon is represented in FIGS. 9 and 10, which show a masked substrate 50 over a cavity 52. In FIG. 9, a relatively wider trench 54 (such as a tether trench 32 or a parasitic gap 28 between fingers 24 and 26) has breached the cavity 52 before a relatively narrower trench 56 (such as a capacitive gap between fingers 24 and 26). A first portion 58 of the substrate 50 (similar to the proof mass 14 of the device 10) is separated from the bulk of the substrate 50 (though still suspended above the cavity 52 and from the bulk of the substrate 50 by some suitable structure not shown in FIGS. 9 and 10). Second and third portions 60 and 62 of the substrate 50 (similar to the proof mass and rim fingers 24 and 26 of the device 10) remain attached to the bulk of the substrate 50 (and are therefore closer to an anchor site on the substrate 50 than the first portion 58). FIG. 9 also shows highly directional and highly energetic physical etchant species 64 being reflected by the floor of the cavity 52 onto the undersides and sidewalls of the first and second portions 58 and 60. FIG. 10 represents the substrate 50 of FIG. 9 immediately after the narrower trench 56 has breached the cavity 52. In FIG. 10, the walls of the first and second portions 58 and 60 of the substrate 50 delineated by the wider trench 54 are both shown as having been subjected to backside and lateral erosion, but the first portion 58 exhibits greater erosion and lateral thinning as a result of being farther from the bulk of the substrate 50 than the second portion 60. In FIG. 10, the walls of the first and second portions 58 and 60 of the substrate 50 delineated by the wider trench 54 are both shown as having been subjected to backside and lateral erosion as a result of being adjacent the wider trench 54, which breached the cavity 52 while the narrower trench 56 was being etched to completion. However, the first portion 58 is shown as having sustained greater backside erosion and lateral thinning than the second portion 60 as a result of being subjected to more rapid etching after breaching of the wider trench 54, since the first portion 58 is farther from the bulk of the substrate 50 than the second portion 60 and therefore experiences greater heating and/or charging during the DRIE process.

In accordance with the above etch phenomenon, the wider hub and tether trenches 17 and 32 (especially the portions of the tether trenches 32 nearer the proof mass 14) and the wider portions of the trenches 28 that define the parasitic gaps between fingers 24 and 26 were found to etch at a faster rate than the remaining portions of these trenches 28 and 32, and therefore breached the cavity 20 first. As etching progressed, erosion on the backside of the suspended structures occurred, causing thinning of the fingers 24 and 26 and tethers 30 in the z axis (perpendicular to the plane of the proof mass 14) and thinning of the fingers 24 and 26 and tethers 30 in the x-y axis (in the plane of the proof mass 14). However, those suspended structures farther from an anchor site to the bulk of the die 12 (e.g., the proof mass fingers 24 and the portions of the tethers 30 farthest from the substrate rim 22) were observed to be more susceptible to backside and lateral erosion than those suspended structures nearer an anchor site (e.g., the rim fingers 26 and the portions of the tethers 30 nearest the substrate rim 22). The overall effect was that the proof mass fingers 24 and portions of the tethers 30 farthest from the rim 22 were significantly narrower than desired or acceptable. In addition, any stiction bumps placed on the proof mass fingers 24 were eroded by excessive etching to the point that they were completely removed, or at least their effectiveness was drastically reduced. In addition, notches and other surface flaws were observed during the investigation. Notching was particularly seen near the distal ends of the fingers 24 and 26 and tethers 30 due to energetic etch species reflection from the angled walls of the cavity 20. Additionally, vertical notches were noted on the sidewalls of suspended structures (fingers 24 and 26, tethers 30, etc.) in locations where the trenches delineating the structures (e.g., trenches 28 or 32) were intersected by a second trench. All of the etch idiosyncrasies described above are believed to be associated to some degree with essentially all DRIE processes in which a suspended structure is delineated by a trench that breaches an underlying cavity.

The present invention addresses the above defects at the masking level by the manner in which those features of the device 10 prone to DRIE overetching are masked. In a preferred process for fabricating the device 10 by DRIE, a suitable etch is first performed to form the cavity 20 in the surface of the substrate 12a (in the form of a wafer of the desired material). A suitable technique is a wet etch of a type known in the art. Following oxidation of the substrate 12a, the semiconductor layer 12b (previously grown on a second wafer) is then bonded to the substrate 12a, with the result that the cavity 20 in the substrate 12a is enclosed by the semiconductor layer 12b. Following selective removal of the second wafer, the remaining substrate 12a and semiconductor layer 12b yield the die 12. The surface of the die 12 is then processed in a manner well known in the art to form layers of the MEMS device 10, after which the surface is masked to protect surface regions of the die 12 corresponding to the proof mass 14, the fingers 24 and 26, the tethers 30 and the surrounding rim 22. A suitable DRIE process for use with this invention employs an Alcatel 601 DRIE machine and a pulsed gas process in accordance with U.S. Pat. No. 6,127,273 to Laermer et al. Another suitable process employs an Alcatel 602 DRIE machine operated at a cryogenic temperature in accordance with Research Disclosure No. 42271, dated June 1999.

FIG. 6 is a detailed plan view of masking in what will be the interdigitized finger region of the device 10, with masks 40 and 42 patterned for etching the fingers 24 and 26, respectively (the fingers 24 and 26 and their after-etch widths are indicated in phantom). Regions of the semiconductor layer 12b remaining exposed between the masks 40 and 42 are also visible in FIG. 6. Notably, while the width of the mask 42 corresponds to the width of the rim finger 26 that will be defined by the mask 42, the mask 40 is significantly wider than the width of the proof mass finger 24 that it will define. As a result, the region of the semiconductor layer 12b that will be exposed by the masks 40 and 42 to the DRIE process to form one of the trenches 28 is narrower than the desired trench 28. According to the invention, once the cavity 20 is breached, the region of the semiconductor layer 12b corresponding to the proof mass finger 24 beneath the mask 40 will etch more rapidly than the region of the semiconductor layer 12b corresponding to the rim finger 26 beneath the mask 42, causing greater undercutting beneath the mask 40 to the extent that the desired width of the proof mass finger 24 (shown in phantom) will be obtained. The ratio of the width of the mask 40 relative to the desired width for the finger 24 will vary depending on various DRIE parameters, the desired width of the trench 28, the width of the trench 28 as compared with the widths of other trenches defining the structure, and the thickness of the finger 24. For a proof mass finger 24 having a desired width of about seven to eight micrometers a thickness (based on the thickness of the semiconductor layer 12b) of about thirty micrometers, separated from its capacitively-coupled rim finger 26 by a trench 28 having a width of about three micrometers, having structural trench widths of about seven micrometers, and parasitic trench widths of about six micrometers, the mask 40 preferably extends beyond each desired edge of the proof mass finger 24 by about 0.5 micrometers.

In reference to FIGS. 7 and 8, if the width of a mask 44 on the semiconductor layer 12b over what will be a tether 30 (the tether 30 and its after-etch width are indicated in phantom) were uniform along the entire length of the tether 30, the tether 30 would be significantly narrower adjacent the proof mass 14 than where the tether 30 attaches to the rim 22, attributable to the greater rate of backside and lateral erosion of the tether 30 with distances farther from the anchor site (rim 22) of the tether 30. To counter these effects, the DRIE process of the present invention entails masking the semiconductor layer 12b to account for the nonuniform etching along the length of the tether 30.

In FIG. 7, the width of the mask 44 for the tether 30 is maintained constant while tapering the gap width of the surface area 46 exposed by the mask 44 and through which the trenches 32 will be etched to delineate the tether 30. The gap width of the exposed surface area 46 is tapered to be wider with decreasing distance from the rim 22 (the anchor site for the tether 30), so that backside and lateral erosion of the tether 30 that occurs more rapidly with increasing distance from the rim 22 is balanced by the more rapid etch rate associated with the increasingly wider gap near the rim 22. As a result, a substantially uniform width for the tether 30 can be obtained. The appropriate ratio of the width of the exposed surface area 46 relative to the desired width of the trenches 32 will vary.

In contrast, the mask 44 for the tether 30 is shown in FIG. 8 as being tapered to increase in width toward the proof mass 14, with the width nearest the proof mass 14 (i.e., farthest from the tether's anchor site at the rim 22) being wider than the width desired for the tether 30, while the width of the mask 44 adjacent the rim 22 (i.e., nearest the rim anchor site) can be patterned to have approximately the width desired for the tether 30. A constant gap width is maintained for the surface area exposed by the mask 44 through which the trenches 32 will be etched to delineate the tether 30. As the distance from the rim 22 increases, backside and lateral erosion is correspondingly more rapid to eventually produce a substantially uniform width for the tether 30. The appropriate ratio of the width of the mask 44 relative to the desired width of the tether 30 will vary, as will the amount of taper in the tether 30 itself along its length.

Significantly, the device 10 represented in FIG. 1 is also configured to maintain a proper environment surrounding the suspended structures (e.g., proof mass 14, fingers 24 and 26, and tethers 30), by avoiding unnecessary variations in trench width. An important example is the avoidance of intersecting trenches that would create a localized wider gap prone to more rapid etching and subsequent backside erosion, lateral erosion and vertical notches. Accordingly, the only intersecting trenches are the finger and tether trenches 28 and 32, which necessarily intersect along the length of each tether 30 in a manner that minimizes the trench width variation.

As noted above, the DRIE process of the present invention also entails appropriate placement of the stiction bumps 34 to avoid being eroded by the etching phenomenon associated with the energetic, highly charged environment of the DRIE process. Because the DRIE process more rapidly etches the proof mass fingers 24, with the result that the mask 40 is undercut, any bumps formed on the fingers 24 would also be rapidly etched and rendered ineffective. As a solution, the present invention relocates the interfinger stiction bumps 34 to the rim fingers 26 by appropriately masking the rim fingers 26, as shown in FIG. 6.

The highly charged environment of the DRIE process has been shown to increase the likelihood of undesirable translation and stiction in the Z-direction of the device 10, possibly as a result of the static charge build-up discussed above. Though the proof mass 14 of the device 10 is particularly stiff in the Z-direction because of the tether design, stiction of the proof mass 14 to the floor 18 of the cavity 20 has been unexpectedly found to be a major yield problem when etching is performed by DRIE. Accordingly, as a direct result of implementing the DRIE process for a mass-produced MEMS device, the present invention provides the stiction bumps 36 formed on the floor 18 of the cavity 20. According to the invention, the bumps 36 are preferably placed directly beneath the proof mass 14, as shown in FIG. 5. A difficulty with forming the bumps 36 is the proper positioning and sizing of the bumps 36 as a result of the highly-directional cavity etch and the DRIE etch. The present invention has shown that the bumps 36 should be placed on the cavity floor 18 away from the edges of the cavity 20 and the trenches 17, 28 and 32 in order to prevent energetic etch species reflection off of the bumps 36 toward the backsides of the cantilevered fingers 24 and 26 and tethers 30, the result of which would be undesirable notching of the structures.

Also a factor in location of the bumps 36 is the high temperature bond oxidation process following the cavity etch, by which the semiconductor layer 12b is bonded to the substrate 12a. The bond process creates a vacuum within the initially sealed cavity 20 as the die 12 returns to room temperature. As a result, the semiconductor layer 12b is elastically pulled downward into the cavity 20 until the cavity 20 is breached by one of the trenches 17, 28 or 32 during the DRIE etch; most preferably, the cavity 20 is breached first by the hub trench 17, which can be readily sized to provide for controlled venting of the cavity 20 away from the relatively fragile fingers 24 and 26 and tethers 30 without adversely affecting the etching process and device performance. The bumps 36 formed during the cavity etch are preferably placed away from regions of maximum deflection of the semiconductor layer 12b so as not to be a source of plastic deformation of the proof mass 14 later defined by etching the semiconductor layer 12b. Accordingly, the stiction bumps 36 of this invention are located uniformly around the inner and outer perimeters of the future proof mass 14, but not beneath any trench or other opening formed through the semiconductor layer 12b. The bumps 36 are also preferably sized to prevent stiction of the proof mass 14 during severe Z-direction translations, while not being so large as to contact the semiconductor layer 12b when deflected as a result of the vacuum within the cavity 20. For this reason, an optimal height for the stiction bumps 36 is believed to be on the order of about one-fourth to about three-fourths of the depth of the cavity 20, which in practice is about eleven micrometers, though shallower or deeper cavities could also been successfully used. Because wet etches suitable for forming the cavity 20 are highly directional in silicon, resulting in different etch rates along different crystalline planes, it will be appreciated by those skilled in the art that the rate at which the height of a stiction bump 36 decreases during the wet etch is a fairly complex function of the etch rates of the exposed facets (silicon directions). Thus, suitable modeling is preferably employed to obtain stiction bumps 36 having the prescribed height.

Those skilled in the art will appreciate that conventional silicon processing techniques and materials can and would be employed in the fabrication of a MEMS device, beyond those discussed above. In addition, while a particular configuration is shown for the proof mass 14, fingers 24 and 26 and tethers 30, various modifications could be made by one skilled in the art. More particularly, the present invention is applicable to essentially any suspended or cantilevered structure that is DRIE etched over a cavity. Finally, it is foreseeable that the present invention could be utilized to encompass a multitude of applications through the addition or substitution of other processing or sensing technologies. Therefore, while the invention has been described in terms of a preferred embodiment, other forms could be adopted by one skilled in the art. Accordingly, the scope of the invention is to be limited only by the following claims.

What is claimed is:

1. A process of forming a microelectromechanical device by a deep reactive ion etching process during which a substrate overlying a cavity is etched to form trenches that breach the cavity to delineate at least two suspended structures, a first and a second of the suspended structures having a first and a second predetermined width, respectively, in a direction parallel to a surface of the substrate, the first suspended structure being farther from an anchor site of the substrate than the second suspended structure, the process comprising the steps of:

masking first and second surface regions of the substrate corresponding to the first and second suspended structures, respectively, in preparation for the etching process so that other surface regions of the substrate corresponding to the trenches remain exposed, the first masked surface region being wider in the direction parallel to the surface than the first predetermined width of the first suspended structure; and then forming the first and second suspended structures by the etching process during which the exposed surface regions of the substrate are etched to form the trenches that delineate the first and second suspended structures and breach the cavity, after which the first suspended structure is subjected to more rapid backside and lateral erosion than the second suspended structure so that at the completion of the etching process the first and second suspended structures have the first and second predetermined widths, respectively.

2. The process according to claim 1, wherein the second masked surface region has a width in the direction parallel to the surface that is approximately equal to the second predetermined width of the second suspended structure.

3. The process according to claim 2, wherein the first and second predetermined widths are approximately equal.

4. The process according to claim 1, wherein the microelectromechanical device comprises a proof mass supported above the cavity and a rim surrounding the proof mass and the cavity.

5. The process according to claim 4, wherein the first suspended structure is one of a first plurality of fingers projecting from the proof mass and each of the first plurality of fingers has a width substantially equal to the first predetermined width, the second suspended structure is one of a second plurality of fingers projecting from the rim and each of the second plurality of fingers has a width substantially equal to the second predetermined width, and the first and second plurality of fingers are interdigitized.

6. The process according to claim 5, further comprising a stiction bump on each of the second plurality of fingers facing an adjacent one of the first plurality of fingers.

7. The process according to claim 5, further comprising multiple stiction bumps on a surface of the cavity beneath only the proof mass.

8. The process according to claim 1, wherein the first and second suspended structures are first and second portions of a single suspended element such that the first portion of the suspended element is farther from the anchor site of the substrate than the second portion of the suspended element, the first and second masked surface regions define a continuous masked surface region corresponding to the suspended element during the masking step, the continuous masked surface region is between two exposed surface regions of the substrate during the masking step, and the suspended element is between the trenches that delineate the first and second portions of the suspended element following the forming step.

9. The process according to claim 8, wherein the continuous masked surface region corresponding to the suspended element has a uniform width, portions of the two exposed surface regions adjacent the second portion of the suspended element are wider than portions of the two exposed surface regions adjacent the first portion of the suspended element such that each of the two exposed surface regions are tapered, and prior to the cavity being breached during the forming step, the portions of the two exposed surface regions adjacent the second portion of the suspended element etch more rapidly than the portions of the two exposed surface regions adjacent the first portion of the suspended element.

10. The process according to claim 8, wherein the first masked surface region corresponding to the first portion of the suspended element is wider than the second masked surface region corresponding to the second portion of the suspended element such that the continuous masked surface region corresponding to the suspended element is tapered, and each of the two exposed surface regions have uniform widths.

11. The process according to claim 1, wherein one of the first and second suspended structures is more fragile than the other.

12. The process according to claim 11, wherein as a result of the masking step, a first of the exposed surface regions delineates the more fragile of the first and second suspended structures and a second of the exposed surface regions delineates the other of the first and second suspended structures, the second exposed surface region being wider than the first exposed surface region, the trench etched in the second exposed surface region breaching the cavity before the trench etched in the first exposed surface region during the forming step.

13. The process according to claim 1, wherein a portion of the substrate overlying the cavity is deflected into the cavity prior to the trenches breaching the cavity during the forming step.

14. The process according to claim 13, further comprising multiple stiction bumps on a surface of the cavity beneath the substrate overlying the cavity, the stiction bumps being located on the surface of the cavity so as not to be contacted by the portion of the substrate deflected into the cavity.

15. A process of forming a microelectromechanical device that includes a substrate overlying a cavity and a rim surrounding the cavity, the process being a deep reactive ion etching process by which the substrate is etched to form trenches that breach the cavity to delineate multiple suspended structures, the multiple suspended structures comprising a proof mass supported above a floor of the cavity and separated from a central hub on the floor by a first of the trenches first fingers cantilevered radially outward from the proof mass and interdigitized with second fingers cantilevered radially inward from the rim and spaced apart from the first fingers by second trenches, and tethers suspended between and interconnecting the proof mass and the rim with a first portion of each tether being adjacent the proof mass and a second portion of each tether being adjacent the rim, each of the tethers being between a pair of third trenches, the first and second fingers and the first and second portions of the tethers having respective predetermined widths in a direction parallel to a surface of the substrate, the trenches defining at least first and second gaps having respective predetermined widths, the process comprising the steps of:

forming the cavity to have an annular shape surrounding the central hub, an outer perimeter, and a first plurality of stiction bumps on the floor of the cavity spaced apart from the central hub and the perimeter of the cavity;

masking surface regions of the substrate corresponding to the proof mass, the first and second fingers, and the tethers so that other surface regions of the substrate corresponding to the trenches remain exposed, the first plurality of stiction bumps being only beneath the masked surface regions corresponding to the proof mass, the masked surface regions corresponding to the first fingers being wider than the predetermined width of the first fingers, the masked surface region corresponding to at least one of the second fingers being masked to define a second stiction bump on the at least one second finger facing a corresponding one of the first fingers with which the at least one second finger is interdigitized; and then micromachining the proof mass, the first and second fingers, and the tethers by the deep reactive ion etching process so that the exposed surface regions corresponding to the trenches are etched and the cavity is first breached by one of the trenches etched through one of the exposed surface areas away from the first and second fingers, and after etching the second trenches that delineate the first and second fingers the first fingers are subject to backside and lateral erosion that undercuts the masked surface regions corresponding to the first fingers so that at the completion of the etching process the first and second fingers, the first and second portions of the tethers, and the first and second gaps have their respective predetermined widths;

wherein the first plurality of stiction bumps are beneath only the proof mass, and the second stiction bump is present on the at least one second finger and faces the corresponding one of the first fingers with which the at least one second finger is interdigitized.

16. The process according to claim 15, wherein the masked surface regions corresponding to the second fingers have widths approximately equal to the predetermined widths of the second fingers.

17. The process according to claim 15, wherein the predetermined widths of the first and second fingers are approximately equal.

18. The process according to claim 15, wherein each of the masked surface regions corresponding to the second fingers is masked to define a stiction bump, so that stiction bumps are formed on each second finger and face the first fingers with which the second fingers are interdigitized.

19. The process according to claim 15, wherein each of the masked surface regions corresponding to the tethers has a uniform width, portions of the exposed surface regions adjacent the second portion of each of the tethers are wider than portions of the exposed surface regions adjacent the first portion of each of the tethers such that each of the exposed surface regions on either side of each tether is tapered, and prior to the cavity being breached during the micromachining step, the portions of the exposed surface regions adjacent the second portions of each of the tethers etch more rapidly than the portions of the exposed surface regions adjacent the first portions of each of the tethers.

20. The process according to claim 15, wherein the masked surface regions corresponding to the first portions of the tethers adjacent the proof mass are wider than the predetermined width of the first portions and wider than the masked surface regions corresponding to the second portions of the tethers adjacent the rim, and the exposed surface regions on either side of the tethers have uniform widths.

21. The process according to claim 20, wherein the masked surface regions corresponding to the second portions of the tethers adjacent the rim are approximately equal to the predetermined widths of the second portions of the tethers.

22. The process according to claim 15, wherein the cavity is first breached by the first trench that separates the proof mass from the central hub.

* * * * *